US010461956B2

(12) United States Patent
Tsuda et al.

(10) Patent No.: US 10,461,956 B2
(45) Date of Patent: Oct. 29, 2019

(54) SEMICONDUCTOR DEVICE, ALLOCATION METHOD, AND DISPLAY SYSTEM

(71) Applicant: Renesas Electronics Corporation, Tokyo (JP)

(72) Inventors: Tetsuji Tsuda, Tokyo (JP); Masaru Hase, Tokyo (JP); Yuki Inoue, Tokyo (JP); Katsushige Matsubara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 314 days.

(21) Appl. No.: 15/631,284

(22) Filed: Jun. 23, 2017

(65) Prior Publication Data
US 2018/0041357 A1 Feb. 8, 2018

(30) Foreign Application Priority Data

Aug. 3, 2016 (JP) .................................. 2016-152720

(51) Int. Cl.
| | |
|---|---|
| *H04L 12/28* | (2006.01) |
| *G06F 11/30* | (2006.01) |
| *G11C 5/04* | (2006.01) |
| *G11C 29/02* | (2006.01) |

(52) U.S. Cl.
CPC ...... *H04L 12/2856* (2013.01); *G06F 11/3034* (2013.01); *G11C 5/04* (2013.01); *G11C 29/025* (2013.01); *H01L 2224/16* (2013.01); *H01L 2924/1305* (2013.01)

(58) Field of Classification Search
CPC ... H04L 12/2856; G06F 11/3034; G11C 5/04; G11C 29/025; H01L 2924/1305; H01L 2224/16
See application file for complete search history.

(56) References Cited

U.S. PATENT DOCUMENTS

| | | | |
|---|---|---|---|
| 5,646,904 A * | 7/1997 | Ohno | .................. G06F 13/1689 |
| | | | 365/233.14 |
| 2010/0169519 A1* | 7/2010 | Zhang | ................. G06F 12/0284 |
| | | | 710/56 |

FOREIGN PATENT DOCUMENTS

JP 6-324999 A 11/1994

* cited by examiner

*Primary Examiner* — Davoud A Zand
*Assistant Examiner* — Kristoffer L S Sayoc
(74) *Attorney, Agent, or Firm* — McDermott Will & Emery LLP

(57) ABSTRACT

A semiconductor device includes a plurality of IP cores, a plurality of storage devices, a configuration information acquiring unit that acquires configuration information for specifying a timing when the IP core accesses the storage device, and an allocation determining unit that determines the storage device allocated to the IP core. The configuration information acquiring unit acquires configuration information regarding a first IP core and configuration information regarding a second IP core. The allocation determining unit determines, based on the configuration information, whether an access timing by the first IP core is the same as an access timing by the second IP core, and when it is determined that the access timings are the same, determines allocation in such a way that the storage device allocated to the first IP core becomes different from the storage device allocated to the second IP core.

11 Claims, 9 Drawing Sheets

SEMICONDUCTOR DEVICE, ALLOCATION METHOD, AND DISPLAY SYSTEM

CROSS-REFERENCE TO RELATED APPLICATIONS

This application is based upon and claims the benefit of priority from Japanese patent application No. 2016-152720, filed on Aug. 3, 2016, the disclosure of which is incorporated herein in its entirety by reference.

BACKGROUND

The present invention relates to a semiconductor device, an allocation method, and a display system, and relates to, for example, allocation of storage devices to Intellectual Property (IP) cores.

In recent devices (e.g., car navigation devices and information entertainment devices), the volume of data to be handled has been increasing since the quality of images and that of sounds have been improving. In accordance therewith, an amount of memory usage of a central processing unit (CPU) mounted on these devices and a dedicated circuit that performs image processing or audio processing has tended to increase. Accordingly, these devices typically include a plurality of storage devices therein, not one storage device.

For example, Japanese Unexamined Patent Application Publication No. 06-324999 discloses a multiprocessor system including a plurality of processors and a plurality of main storage devices.

SUMMARY

When there are a plurality of devices that access a storage device, stagnation of access occurs due to concentration of access to one storage device. While Japanese Unexamined Patent Application Publication No. 06-324999 discloses a technique of reducing the overhead of a main storage reference request, it does not disclose suppression of stagnation of access due to concentration of access.

The other objects and the novel characteristics of the present invention and the other problems solved by the present invention will be made apparent from the descriptions of the specification and the accompanying drawings.

According to one embodiment, a semiconductor device determines, based on configuration information regarding a first IP core and configuration information regarding a second IP core, whether an access timing by the first IP core is the same as an access timing by the second IP core, and when it is determined that the access timings are the same, determines allocation in such a way that a storage device allocated to the first IP core becomes different from a storage device allocated to the second IP core.

According to the embodiment, it is possible to suppress stagnation of access due to concentration of access to a storage device.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

For the sake of clarification of the descriptions, the following descriptions and the drawings may be omitted and simplified as appropriate. Throughout the drawings, the same components are denoted by the same reference symbols and overlapping descriptions will be omitted as appropriate.

<Matters Studied by Inventor>

Figure 8:
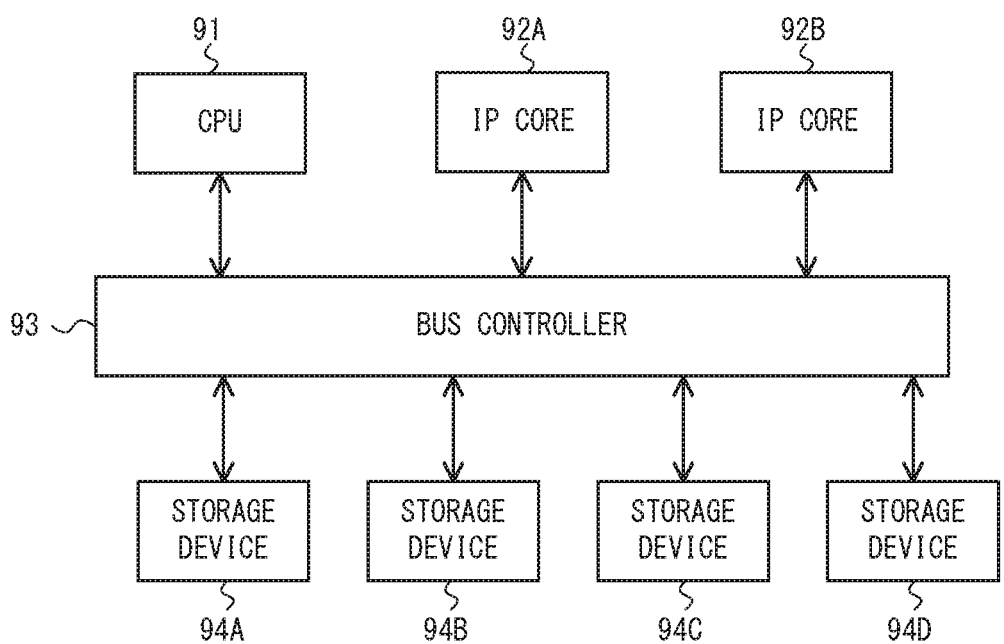
FIG. 8 is a block diagram showing a configuration of a semiconductor device according to a comparative example.

Further, matters studied by the inventor in advance will be described. FIG. 8 is a block diagram showing a configuration of a semiconductor device 90 according to a comparative example. The semiconductor device 90 includes a CPU 91, IP cores 92A and 92B, a bus controller 93, and storage devices 94A, 94B, 94C, and 94D. That is, the semiconductor device 90 includes a plurality of IP cores and a plurality of storage devices. While the semiconductor device 90 includes two IP cores and four storage devices as one example in FIG. 8, each of the number of IP cores and the number of storage devices may be any number equal to or larger than two.

In the following description, the IP core 92A and the IP core 92B are each simply referred to as an IP core 92 when it is not necessary to differentiate them. In a similar way, the storage device 94A, the storage device 94B, the storage device 94C, and the storage device 94D are each simply referred to as a storage device 94 when it is not necessary to differentiate them. In the description of embodiments given later, components of the same type will be described in a similar way when it is not necessary to differentiate them.

In the semiconductor device 90, the CPU 91, the IP core 92A, and the IP core 92B may access the storage device 94. Therefore, when the data area of the IP core 92A and the data area of the IP core 92B are arranged in the same storage device 94 (e.g., the storage device 94A), for example, a particular device is accessed by the IP cores 92. That is, while the semiconductor device 90 includes four-channel storage systems composed of the four storage devices 91, when the data areas are arranged as stated above, one channel is intensively accessed. Accordingly, the bandwidth that the IP core 92 uses exceeds the maximum bandwidth per channel, which results in access stagnation.

In order to prevent the particular device from being accessed in a biased manner, it may be possible to allocate the data areas to the respective storage devices 94 for each predetermined address unit by the bus controller 93. The bus controller 93 allocates, for example, the data areas of the CPU 91 and those of the IP core 92 to the respective storage devices 94, with 4K (kilo) byte as one unit. Specifically, the bus controller 93 distributes, for example, the data areas of the IP core 92A to the respective storage devices 94 as follows. The first data area of the IP core 92A is arranged in the storage device 94A, the second data area of the IP core 92A is arranged in the storage device 94B, the third data area of the IP core 92A is arranged in the storage device 94C, and the fourth data area of the IP core 92A is arranged in the storage device 94D. The first data area as an area accessed when the address of the destination accessed by the IP core 92A is in a range from 4K×n to 4K×(n+1)−1. Further, the second data area is an area accessed when the address of the destination accessed by the IP core 92A is in a range from 4K×(n+1) to 4K×(n+2)−1. Further, the third data area is an area accessed when the address of the destination accessed by the IP core 92A is in a range from 4K×(n+2) to 4K×(n+3)−1. Further, the fourth data area is an area accessed when the address of the destination accessed by the IP core 92A is in a range from 4K×(n+3) to 4K×(n+4)−1.

Figure 9:
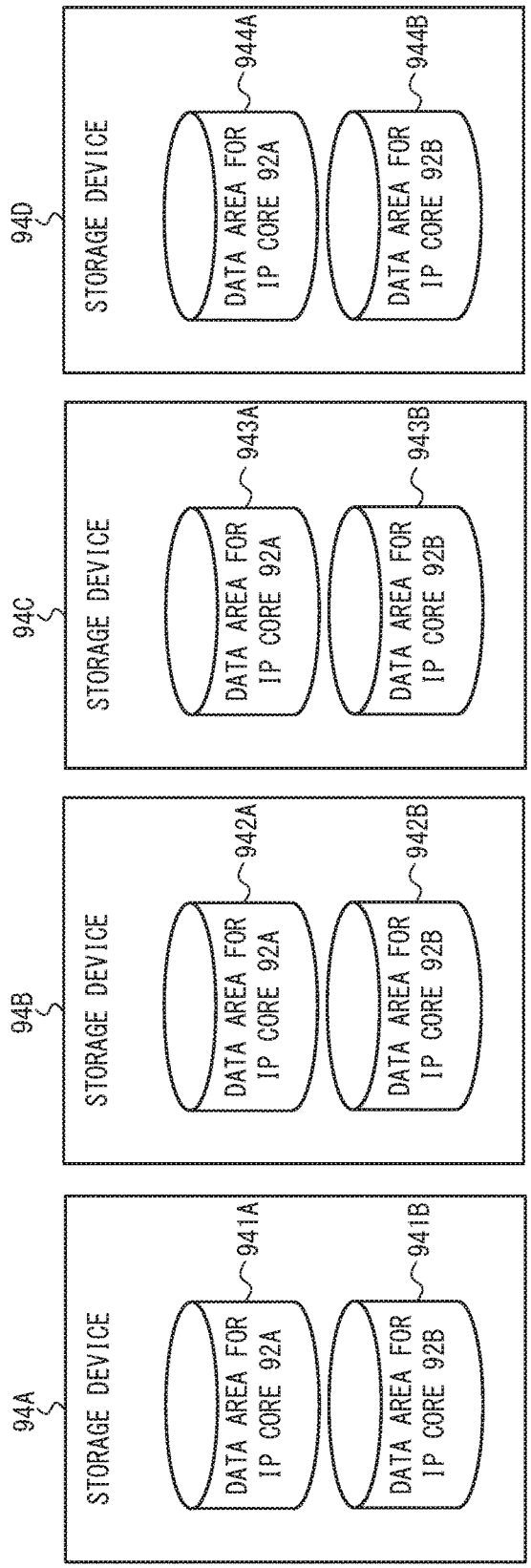
FIG. 9 is a schematic view showing allocation of data areas according to the comparative example.

When the data areas are allocated as stated above, a state shown in FIG. 9, for example, occurs. FIG. 9 is a schematic view showing allocation of data areas according to the comparative example. In the example shown in FIG. 9, a data area 941A for the IP core 92A and a data area 941B for the IP core 92B are arranged in the storage device 94A. In a similar way, a data area 942A for the IP core 92A and a data area 942B for the IP core 92B are arranged in the storage device 94B. Further, a data area 943A for the IP core 92A and a data area 943B for the IP core 92B are arranged in the storage device 94C. Further, a data area 944A for the IP core 92A and a data area 944B for the IP core 92B are arranged in the storage device 94D.

Even when the data areas are arranged as stated above, when the IP core 92A and the IP core 92B access the same storage device 94 at the same timing, access stagnation may occur. It is assumed, for example, that the IP core 92A performs image processing for displaying moving images on a display device provided in a front seat of an automobile and the IP core 92B performs image processing for displaying moving images on a display device provided in a back seat of the automobile. In this case, when the format of the moving images displayed on the display device in the front seat is the same as the format of the moving images displayed on the display device in the back seat, the following access occurs. The format of the moving images herein means a specification that specifies the frame rate of the moving images and the data size of the images that compose the moving images.

Since the two formats are the same, the IP core 92A and the IP core 92B access the same storage device 94 at the same timing. For example, the timing when the IP core 92A accesses the data area 941A of the storage device 94A becomes the same as the timing when the IP core 92B accesses the data area 941B of the storage device 94A. Such an overlapping access to one storage device 94 periodically continues to occur. That is, stagnation of access steadily occurs. When it is defined to display images of 60 frames per second as a frame rate, each of the IP cores 92 needs to process a frame image for every 16.6 milliseconds. However, when access is stagnated, each of the IP cores 92 cannot complete the image processing within this time. This results in occurrence of drop frame of the image to be displayed. In this way, when the IP core 92 is a dedicated circuit that executes processing in accordance with a specified rate, steady stagnation of access occurs, which results in stagnation of processing.

Outline of Embodiments

Figure 1:
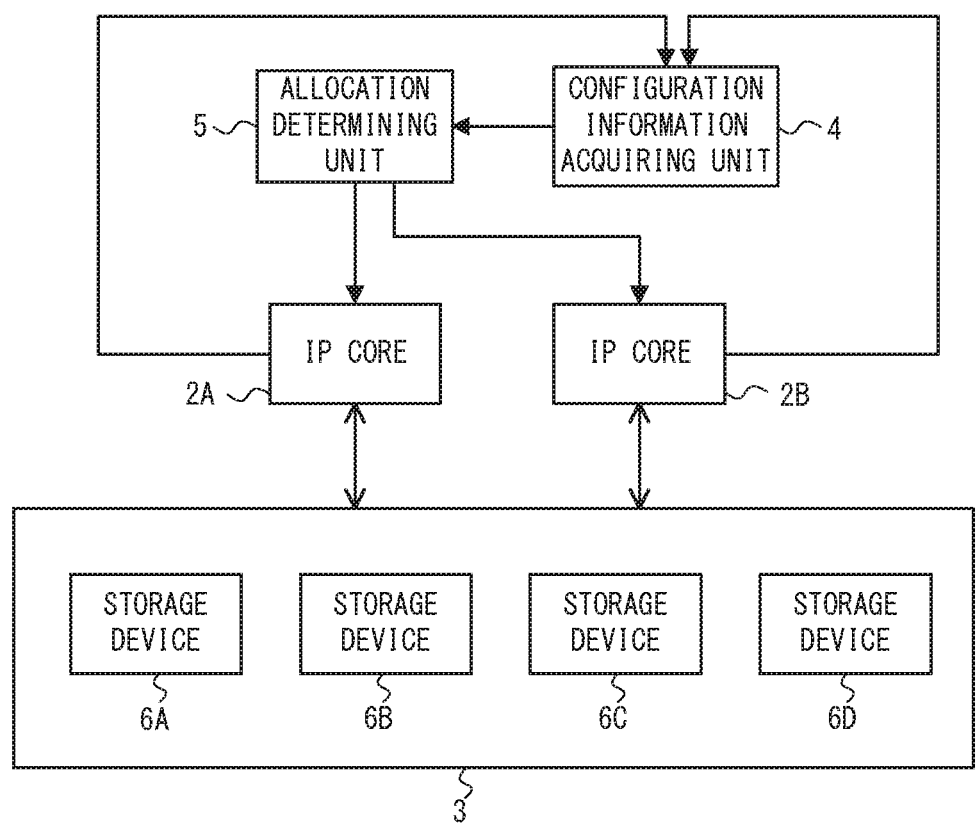
FIG. 1 is a block diagram showing one example of a configuration of a semiconductor device according to an outline of embodiments.

Next, embodiments will be described. Prior to giving the description of the embodiments, the outline of the embodiments will be described. FIG. 1 is a block diagram showing one example of a configuration of a semiconductor device 1 according to the outline of the embodiments.

As shown in FIG. 1, the semiconductor device 1 includes, as a plurality of IP cores, an IP core 2A and an IP core 2B. The semiconductor device 1 further includes a storage system 3, a configuration information acquiring unit 4, and an allocation determining unit 5.

Each of the IP cores 2 is a dedicated circuit that performs predetermined processing. The predetermined processing includes, for example, processing performed at a specified rate. The processing performed at a specified rate includes, for example, image processing for displaying moving images, audio processing for outputting audio, and communication processing for performing transmission at a predetermined transmission rate. Accordingly, in one example, each of the IP cores 2A and 2B is a dedicated circuit that performs the image processing. Each of the IP cores 2 executes processing using the storage system 3. In other words, each of the IP cores 2 accesses the storage device 6 included in the storage system 3 to execute the processing.

The storage system 3 includes a plurality of storage devices. Specifically, the storage system 3 includes storage devices 6A, 6B, 6C, and 6D. Each of the storage devices 6 is, for example, a volatile memory such as a Double DATA Rate (DDR) memory. However, each of the storage devices 6 is not limited to this and may be a storage device of another type. Each of the storage devices 6 may be, for example, a hard disc drive.

The configuration information acquiring unit 4 acquires configuration information at a time of starting of processing using the storage system 3 by the IP core 2. This configuration information is information that specifies the timing when the IP core 2 accesses one of the storage devices 6 and is, for example, information indicating the format of the aforementioned moving images. The configuration information acquiring unit 4 acquires the configuration information regarding the IP core 2A and the configuration information regarding the IP core 2B.

The allocation determining unit 5 determines the storage device 6 allocated to the IP core 2 among the IP cores 2 that starts processing. When it is required to allocate the data areas to the IP core 2A and the IP core 2B, respectively, the allocation determining unit 5 determines allocation as follows.

First, the allocation determining unit 5 determines, based on the configuration information regarding the IP core 2A and the configuration information regarding the IP core 2B acquired by the configuration information acquiring unit 4, whether the timing when the IP core 2A accesses one of the storage devices 6 is the same as the timing when the IP core 2 accesses one of the storage devices. When it is determined that the access timings are the same, the allocation determining unit 5 determines the allocation in such a way that the storage device 6 allocated to the IP core 2A becomes different from the storage device 6 allocated to the IP core 2B. When it is not determined that the access timings are the same, the allocation determining unit 5 performs an arbitrary allocation. Also, when it is not determined that the access timings are the same, the allocation determining unit 5 performs allocation in accordance with, for example, a predetermined allocating rule. Therefore, in this case, the storage device 6 allocated to the IP core 2A may be the same as the storage device 6 allocated to the IP core 2B.

Figure 2:
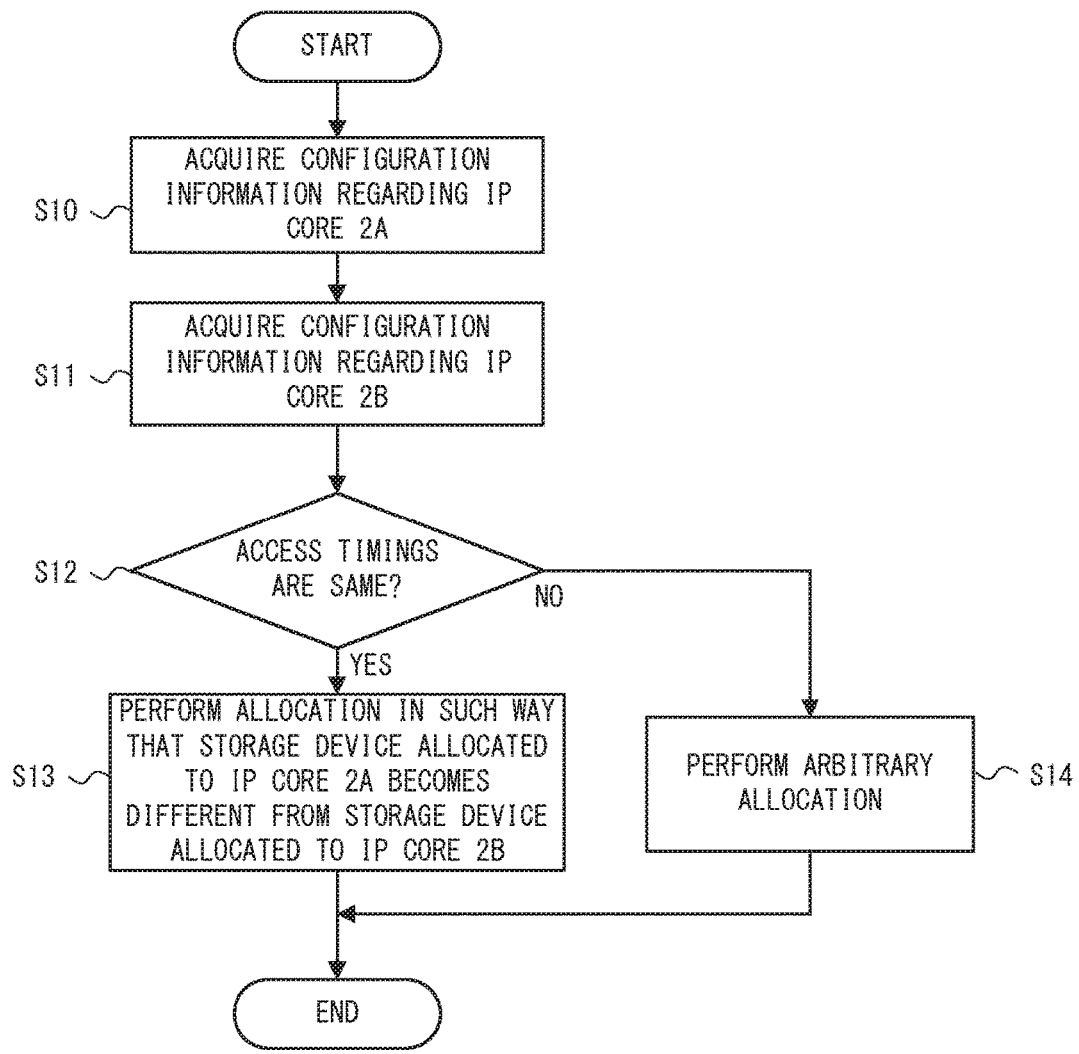
FIG. 2 is a flowchart showing one example of an operation of allocating data areas in the semiconductor device according to the outline of the embodiments.

FIG. 2 is a flowchart showing one example of an operation of allocating data areas in the semiconductor device 1 according to the outline of the embodiments. In the following description, with reference to FIG. 2, the operation of allocating the data areas in the semiconductor device 1 will be described.

In Step 10 (S10), the configuration information acquiring unit 4 acquires the configuration information regarding the IP core 2A at a time of starting of the processing that uses the storage system 3 by the IP core 2A.

Next, in. Step 11 (S11), the configuration information acquiring unit 4 acquires the configuration information regarding the IP core 2B at a time of starting of the processing that uses the storage system 3 by the IP core 2B.

Step 10 and Step 11 may be reversed or both steps may be concurrently performed.

Next, in Step 12 (S12), the allocation determining unit 5 determines, based on the configuration information acquired in Step 10 and the configuration information acquired in Step 11, whether the timing when the IP core 2A accesses the storage device 6 is the same as the timing when the IP core 2B accesses the storage device 6. When it is determined that the access timings are the same (YES in S12), the allocation processing moves to Step 13. On the other hand, when it is determined that the access timings are different from each other (NO in S12), the allocation processing moves to Step 14.

In Step 13 (S13), the allocation determining unit 5 determines allocation of the storage device 6 to the IP core 2A and allocation of the storage device 6 to the IP core 2B in such a way that the storage device 6 allocated to the IP core 2A and the storage device 6 allocated to the IP core 2B become different from each other.

In Step 14 (S14), the allocation determining unit 5 performs an arbitrary allocation.

According to the semiconductor device 1, it can be determined, from the configuration information acquired by the configuration information acquiring unit 4, whether the timings when the plurality of IP cores 2 perform access overlap each other. When the access timings overlap each other, different storage devices 6 can be allocated to the respective IP cores 2. Accordingly, it is possible to prevent concentration of access to the same storage device 6 and to suppress stagnation of access. Accordingly, when the IP core 2 is a dedicated circuit that performs image processing, for example, it is possible to suppress drop frame of the moving images. Further, when the IP core 2 is a dedicated circuit that performs audio processing, it is possible to suppress interruption of sound while it is being reproduced. In summary, even when contents having a high image quality or contents having a high sound quality are reproduced, it becomes possible to reproduce the contents while suppressing disturbance of the video images or disturbance of the audio.

First Embodiment

Figure 3:
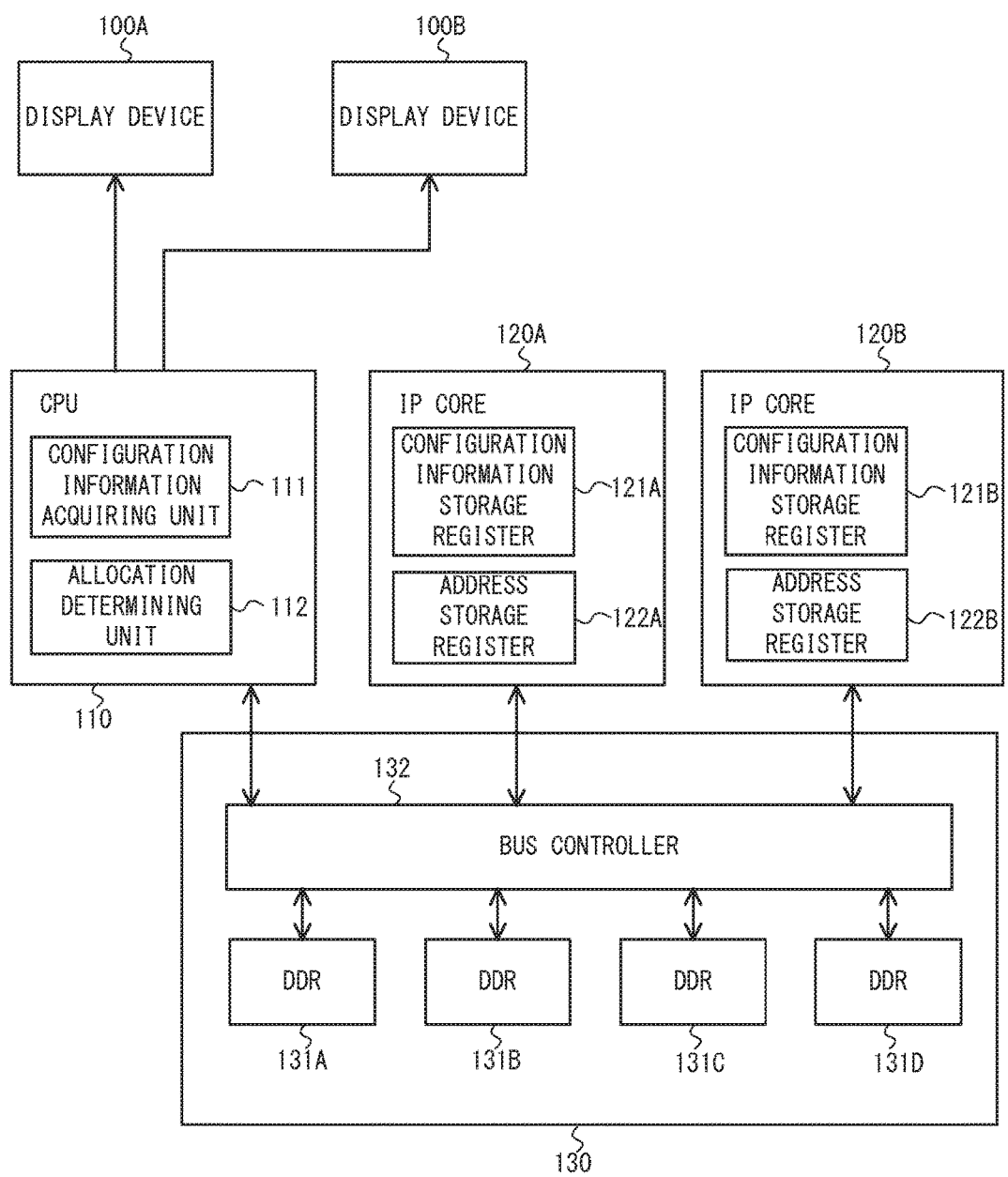
FIG. 3 is a block diagram showing one example of a configuration of a display system according to a first embodiment.

Next, a first embodiment will be described. FIG. 3 is a block diagram showing one example of a configuration of a display system 10 according to the first embodiment. As shown in FIG. 3, the display system 10 includes display devices 100A and 100B, a CPU 110, IP cores 120A and 120B, and a storage system 130. The display system 10 is, for example, a display system mounted on an automobile.

Each of the display devices 100 is a display such as a liquid crystal display or an organic EL display. The display device 100A is, for example, a display device provided in a front seat of an automobile and the display device 100B is a display device provided in a back seat of the automobile. The display device 100 displays video images processed by the IP core 120. Specifically, the display device 100A displays, for example, video images processed by the IP core 120A and the display device 100B displays video images processed by the IP core 120B.

The CPU 110 controls the whole display system 10 by executing a program loaded to a DDR 131 in the storage system 130 or a program loaded to a memory (not shown) included in the display system 10. As one example of this control, the CPU 110 performs control to display the video images processed by the IP core 120 on the display device 100. The CPU 110 performs processing, for example, for displaying and outputting the image data processed by the IP core 120 and stored in the storage system 130 onto the display device 100.

Further, the execution of the program by the CPU 110 embodies a configuration information acquiring unit 111 and an allocation determining unit 112. That is, the display system 10 further includes the configuration information acquiring unit 111 and the allocation determining unit 112. The details of the configuration information acquiring unit 111 and the allocation determining unit 112 will be described later. In this way, the display system 10 includes functions as a computer.

Further, the aforementioned program can be stored and provided to a computer using any type of non-transitory computer readable media. Non-transitory computer readable media include any type of tangible storage media. Examples of non-transitory computer readable media include magnetic storage media (such as flexible disks, magnetic tapes, hard disk drives, etc.), optical magnetic storage media (e.g., magneto-optical disks), Compact Disc Read Only Memory (CD-ROM), CD-R, CD-R/W, and semiconductor memories (such as mask ROM, Programmable ROM (PROM), Erasable PROM (EPROM), flash ROM, Random Access Memory (RAM), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

Each of the IP cores 120 is a dedicated circuit that performs predetermined processing and in this embodiment, a dedicated circuit that performs predetermined image processing such as decode processing. Each of the IP cores 120 accesses the DDR 131 included in the storage system 130 when the image processing is performed. Further, in this embodiment, the IP core 120A executes image processing for generating image data to be displayed on the display device 100A and the IP core 120B executes image processing for generating image data to be displayed on the display device 100B. The IP core 120 may process, for example, data of moving image contents stored in a storage device ((not shown) of the display system 10 or data of moving image contents received by the display system 10. Further, the IP core 120 may process video data captured by a camera (not shown) provided in the automobile on which the display system 10 is mounted.

The IP core 120A includes a configuration information storage register 121A and an address storage register 122A. In a similar way, the IP core 120B includes a configuration information storage register 121B and an address storage register 122B.

Each of the configuration information storage registers 121 is a register that stores the aforementioned configuration information. In this embodiment, the configuration information storage register 121 is a register that stores information indicating the format of the moving images, which is the configuration information. Specifically, the configuration information storage register 121 stores, as the configuration information, information that specifies the frame rate of the moving images, the image size of the moving images, and the color format. The color format means a specification for specifying the number of colors of each pixel. By specifying the size of the image displayed on the display device 100 and the color format of this image, the data size of this image can be specified.

The IP core 120 accesses the DDR 131 in a predetermined data unit. Further, the IP core 120 needs to process one frame image within a specified period of time defined by the frame rate of the moving images (e.g. 16.6 milliseconds). Accordingly, the IP core 120 repeats the access with a predetermined data unit within the specified period of time a number of times in accordance with the data size of the image of one frame. Accordingly, the configuration information, that is, information indicating the format of the moving images, becomes information that specifies the access timing.

The configuration information is set in the configuration information storage register 121 by the CPU 110 at the time of starting of processing by the IP core 120. When the display device 100A and the display device 100B concurrently display the same video images, the configuration information set in the configuration information storage register 121A of the IP core 120A becomes equal to the configuration information set in the configuration information storage register 121B of the IP core 120B. That is, in this case, the frame rate of the moving images processed by the IP core 120A becomes the same as the frame rate of the moving images processed by the IP core 120B and the data size of the images of the moving images processed by the IP core 120A becomes the same as the data size of the images of the moving images processed by the IP core 120B. Accordingly, the access timing by the IP core 120A becomes the same as the access timing by the IP core 120B.

Each of the address storage registers 122 is a register that stores the address to specify the data area allocated to the IP core 120. The address storage register 122 stores, for example, the top address of the data area allocated to the IP core 120. The IP core 120 specifies the access destination by referring to the address stored in the address storage register 122. When the allocation of the data area to the IP core 120 is determined by the allocation determining unit 112, the address in accordance with the allocation that has been determined is set in the address storage register 122 of the IP core 120.

The storage system 130 includes, as a plurality of storage devices, DDRs 131A, 131B, 131C, and 131D, which are DDR memories. The storage system 130 further includes a bus controller 132. The DDR 131 stores the image data that has undergone the processing by the IP core 120. The bus controller 132 controls writing or reading to or from the DDR 131 by the CPU 110 and the IP core 120. The bus controller 132 does not allocate the data area to the IP core 120, unlike the bus controller 93 in the semiconductor device 90 according to the comparative example. In this embodiment, this allocation is performed by the allocation determining unit 112 that will be described later.

The configuration information acquiring unit 111 corresponds to the aforementioned configuration information acquiring unit 4. Accordingly, the configuration information acquiring unit 111 acquires the configuration information regarding the IP core 120A at a time of starting of processing using the storage system 130 by the IP core 120A. Specifically, the configuration information acquiring unit 111 reads out the content stored in the configuration information storage register 121A of the IP core 120A to acquire the configuration information. Further, the configuration information acquiring unit 111 acquires the configuration information regarding the IP core 120B at a time of starting of processing using the storage system 130 by the IP core 120B. Specifically, the configuration information acquiring unit 111 reads out the content stored in the configuration information storage register 121B of the IP core 120B to acquire the configuration information.

The allocation determining unit 112 corresponds to the aforementioned allocation determining unit 5. Accordingly, the allocation determining unit 112 determines the DDR 131 to be allocated to the IP core 120 among the IP cores 120 that starts the processing. The allocation determining unit 112 determines allocation as follows, in a way similar to that of the allocation determining unit 5. That is, the allocation determining unit 112 determines, based on the configuration information regarding the IP core 120A and the configuration information regarding the IP core 120B acquired by the configuration information acquiring unit 111, whether the timing when the IP core 120A accesses the DDR 131 is the same as the timing when the IP core 120B accesses the DDR 131. When it is determined that the access timings are the same, the allocation determining unit 112 determines allocation in such a way that the DDR 131 allocated to the IP core 120A becomes different from the DDR 131 allocated to the IP core 120B. When it is not determined that the access timings are the same, the allocation determining unit 112 performs an arbitrary allocation.

When the allocation determining unit 112 determines the allocation, the allocation determining unit 112 sets the address indicating the address space of the DDR 131 allocated to the IP core 120 in the address storage register 122 of the IP core 120. In this embodiment, the allocation determining unit 112 sets a physical address of the DDR 131 in the address storage register 122.

The allocation determining unit 112 may perform, besides the allocation of the data area to the IP core 120, allocation of the data area to the CPU 110.

Figure 4:
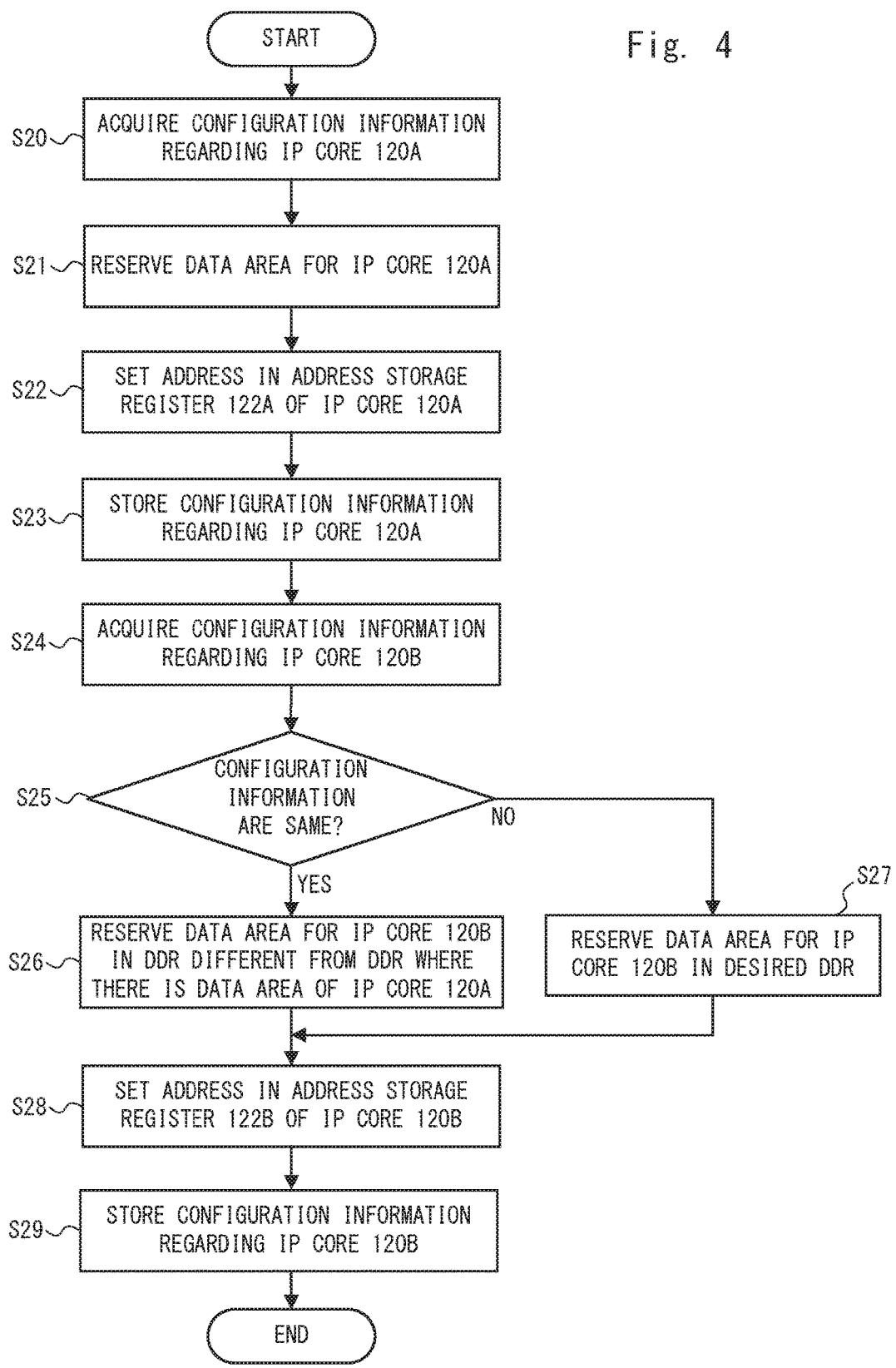
FIG. 4 is a flowchart showing one example of an operation of allocating data areas in the display system according to the first embodiment.

FIG. 4 is a flowchart showing one example of the operation of allocating the data areas in the display system 10 according to the first embodiment. The flowchart shown in FIG. 4 is, for example, a flowchart showing an allocation operation when the same video images are concurrently displayed on the display device 100A and the display device 100B. Even when the same video images are concurrently displayed on the display device 100A and the display device 100B, startup processing in each of the IP cores 120 is typically performed sequentially. Therefore, one example of the startup processing is expressed as shown in FIG. 4. However, the startup processing in each of the IP cores 120 may be concurrently performed in parallel. That is, instead of performing reservation of the data area for the IP core 120B after reservation of the data area for the IP core 120A, the reservation of the data areas for the respective IP cores 120 may be concurrently performed. In the following description, with reference to FIG. 4, the operation of allocating the data areas in the display system 10 will be described.

In Step 20 (S20), the configuration information acquiring unit 111 acquires the configuration information regarding the IP core 120A from the configuration information storage register 121A.

Next, in Step 21 (S21), the allocation determining unit 112 reserves the data area for the IP core 120A. At this time, there is no access contention with an IP core 120 other than the IP core 120A. Therefore, the allocation determining unit 112 reserves the data area for the IP core 120A in a desired DDR 131.

Next, in Step 22 (S22), the allocation determining unit 112 sets the address indicating the address space of the DDR 131 allocated to the IP core 120A in the address storage register 122A of the IP core 120A. In this way, the IP core 120A is ready to start image processing.

Next, in Step 23 (S23), the allocation determining unit 112 stores the configuration information acquired in Step 20. Specifically, the allocation determining unit 112 stores this configuration information in, for example, a data area on the DDR 131 allocated to the CPU 110.

Next, in Step 24 (S24), the configuration information acquiring unit 111 acquires the configuration information regarding the IP core 120B from the configuration information storage register 121B. Since the configuration information has already been stored in Step 23, the allocation determining unit 112 determines that the access by the IP core 120B and access by another IP core 120 may overlap each other and performs determination in Step 25.

In Step 25 (525), the allocation determining unit 112 determines whether the configuration information regarding the IP core 120A stored in Step 23 is the same as the configuration information regarding the IP core 1205 acquired in Step 24. When the both configuration information are the same, the allocation processing moves to Step 26. On the other hand, when the both configuration information are not the same, the allocation processing moves to Step 27.

In Step 26 (S26), the allocation determining unit 112 reserves the data area for the IP core 1205 in a DDR 131 different from the DDR 131 where there is a data area of the IP core 120A. It is therefore possible to prevent the IP core 120A and the IP core 120B from accessing the same DDR 131 at the same timing. Then the allocation processing moves to Step 28.

On the other hand, in Step 27 (S27), overlapping access to the same storage device 94 does not continue to occur periodically, whereby the allocation determining unit 112 reserves the data area for the IP core 120B in a desired DDR 131. Then the allocation processing goes to Step 28.

In Step 28 (S28), the allocation determining unit 112 sets the address indicating the address space of the DDR 131 allocated to the IP core 120B in the address storage register 122B of the IP core 120B. In this way, the IP core 120B is ready to start image processing.

Next, in Step 29 (S29), the allocation determining unit 112 stores the configuration information acquired in Step 24.

According to the aforementioned processing, the allocation processing is completed and the image processing by the IP core 120A and the image processing by the IP core 120B are performed in parallel.

In the aforementioned description, the display system 10 according to the first embodiment has been described.

According to the display system 10, it is possible to determine, from the configuration information acquired by the configuration information acquiring unit 111, whether the access timings by the plurality of IP cores 120 overlap each other. When the access timings overlap each other, different DDRs 131 may be allocated to the respective IP cores 120. Accordingly, even when the same video images are concurrently displayed on the display device 100A and the display device 100B, disturbance of the video images can be suppressed.

Second Embodiment

Next, a second embodiment will be described. In the first embodiment, at the time of starting of the processing by the IP core, the data area for the IP core is reserved and the data area is not changed after the start of the processing by the IP core. Accordingly, when the access load of the storage device reserved for the data area for this IP core is increased due to an access by a processing unit other than this IP core after the start of the processing by the IP core, access of this IP core may be stagnated. Therefore, in this embodiment, a mechanism for changing the data area allocated to the IP core is provided.

Figure 5:
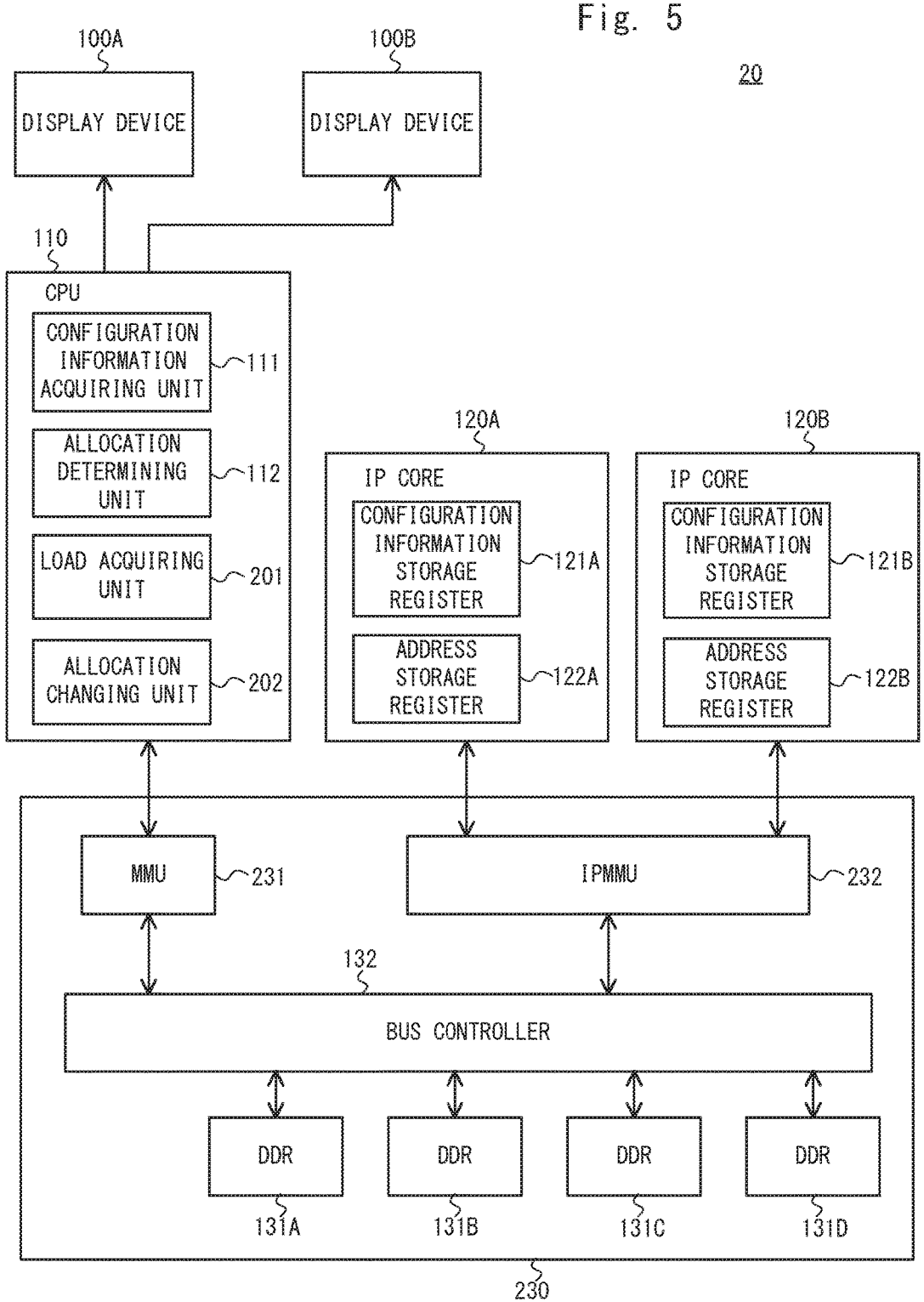
FIG. 5 is a block diagram showing one example of a configuration of a display system according to a second embodiment.

FIG. 5 is a block diagram showing one example of a configuration of a display system 20 according to the second embodiment. The display system 20 according to the second embodiment is different from the display system 10 according to the first embodiment in that the display system 20 further includes a load acquiring unit 201 and an allocation changing unit 202 and includes a storage system 230 in place of the storage system 130. Further, the second embodiment is different from the first embodiment in that a virtual address is set in the address storage register 122. That is, the IP core 120 according to this embodiment specifies the access destination using the virtual address. In the following description, descriptions of the configurations and the operations the same as those of the display system 10 according to the first embodiment will be omitted.

The storage system 230 further includes, besides the components of the storage system 130 according to the first embodiment, an MMU 231 and an IPMMU 232. Each of the MMU 231 and the IPMMU 232 is a memory management unit. That is, each of the MMU 231 and the IPMMU 232 is a circuit that performs conversion from the virtual address into a physical address.

The MMU 231 is a memory management unit that causes the CPU 110 to access the DDR 131. The MMU 231 converts the virtual address of the access destination specified by the CPU 110 into a physical address of the DDR 131 and notifies the bus controller 132 of this physical address. The IPMMU 232 is a memory management unit that causes the IP core 120 to access the DDR 131. The IPMMU 232 converts the virtual address of the access destination specified by the IP core 120 into the physical address of the DDR 131 and notifies the bus controller 132 of this physical address. Accordingly, in this embodiment, the virtual address is stored in the address storage register 122.

Further, in this embodiment, the execution of the program by the CPU 110 embodies, besides the configuration information acquiring unit 111 and the allocation determining unit 112, the load acquiring unit 201 and the allocation changing unit 202.

The load acquiring unit 201 acquires the access load of each of the plurality of DDRs 131. Since the bus controller 132 manages the access load of each of the DDRs 131, the load acquiring unit 201 regularly acquires the information on the access load of each of the DDRs 131 from the bus controller 132.

The allocation changing unit 202 changes, based on the access load of each of the plurality of DDRs 131 acquired by the load acquiring unit 201, the original allocation determined by the allocation determining unit 112. In this embodiment, when the allocation determining unit 112 allocates the data area (that is, the DDR 131) to the IP core 120, the allocation determining unit 112 performs the following operation.

That is, the allocation determining unit 112 sets, in the address storage register 122 of this IP core 120, the virtual address to specify the address of this data area, and notifies the IPMMU 232 that the physical address of the DDR 131, which is the address of this data area, is the address after conversion of the virtual address. The IPMMU 232 performs conversion in accordance with this notification. Accordingly, when the IPMMU 232 accepts the specification of the access destination by the virtual address from the IP core 120, the IPMMU 232 converts the virtual address that has been accepted into the physical address regarding which notification has been sent to the allocation determining unit 112 as an address converted from the virtual address. The IPMMU 232 performs conversion from the virtual address to the physical address in accordance with a conversion rule regarding which notification has been sent from the allocation determining unit 112 until the time the change by the allocation changing unit 202 is performed.

Specifically, the allocation changing unit 202 changes the allocation by changing the physical address after the conversion corresponding to the virtual address before the conversion from a first physical address to a second physical address. The allocation changing unit 202 notifies the IPMMU 232 of the change in the physical address after the conversion. Upon receiving the notification from the allocation changing unit 202, the IPMMU 232 performs conversion in accordance with a new conversion rule in the following conversion processing.

The virtual address that the allocation determining unit 112 has set in the address storage register 122A of the IP core 120A is denoted by v_add and the physical address converted from v_add is denoted by p_add1. In this case, the IPMMU 232 converts v_add into p_add1. Assume a case, for example, that the data area allocated to the IP core 120A has been changed from the DDR 131A to the DDR 131B by the allocation changing unit 202. The allocation changing unit 202 notifies the IPMMU 232 that the physical address converted from v_add should be p_add2, which is the physical address of the data area in the DDR 131B, not p_add1, which is the physical address of the data area in the DDR 131A. At this time, there is no change in the virtual address set in the address storage register 122A of the IP core 120A and v_add continues to be stored. After the IPMMU 232 receives the notification regarding the change from the allocation changing unit 202, the IPMMU 232 converts v_add into p_add2. Accordingly, the allocation to the IP core 120A is changed. Further, in this case, the IP core 120 may access the new data area using the virtual address the same as the address before the change.

Further, the allocation changing unit 202 changes, when the access load of the DDR 131 allocated to a predetermined IP core among the plurality of IP cores 120 by the allocation determining unit 112 is equal to or larger than a predetermined threshold (this threshold is denoted by Th), the DDR 131 to be allocated to the predetermined IP core 120.

It is assumed, for example, that the predetermined IP core 120 is the IP cores 120A and 120B, the DDR 131A is allocated to the IP core 120A, and the DDR 131B is allocated to the IP core 120B. In this case, the allocation changing unit 202 changes, when the access load of the DDR 131A becomes equal to or larger than the threshold Th, the DDR 131 to be allocated to the IP core 120A. Further, the allocation changing unit 202 changes, when the access load of the DDR 131B becomes equal to or larger than the threshold Th, the DDR 131 to be allocated to the IP core 120B. The allocation changing unit 202 sets, for example, the DDR 131 whose access load is smaller than the threshold Th as the DDR 131 to be newly allocated. Alternatively, the allocation changing unit 202 may set the DDR 131 whose access load is smaller than another threshold that is smaller than the threshold Th as the DDR 131 to be newly allocated. In this way, the access destination is changed when the access load becomes equal to or larger than a threshold, whereby it is possible to suppress stagnation of access in, for example, the predetermined IP core 120 where it is desired to prevent stagnation of access.

Figure 6:
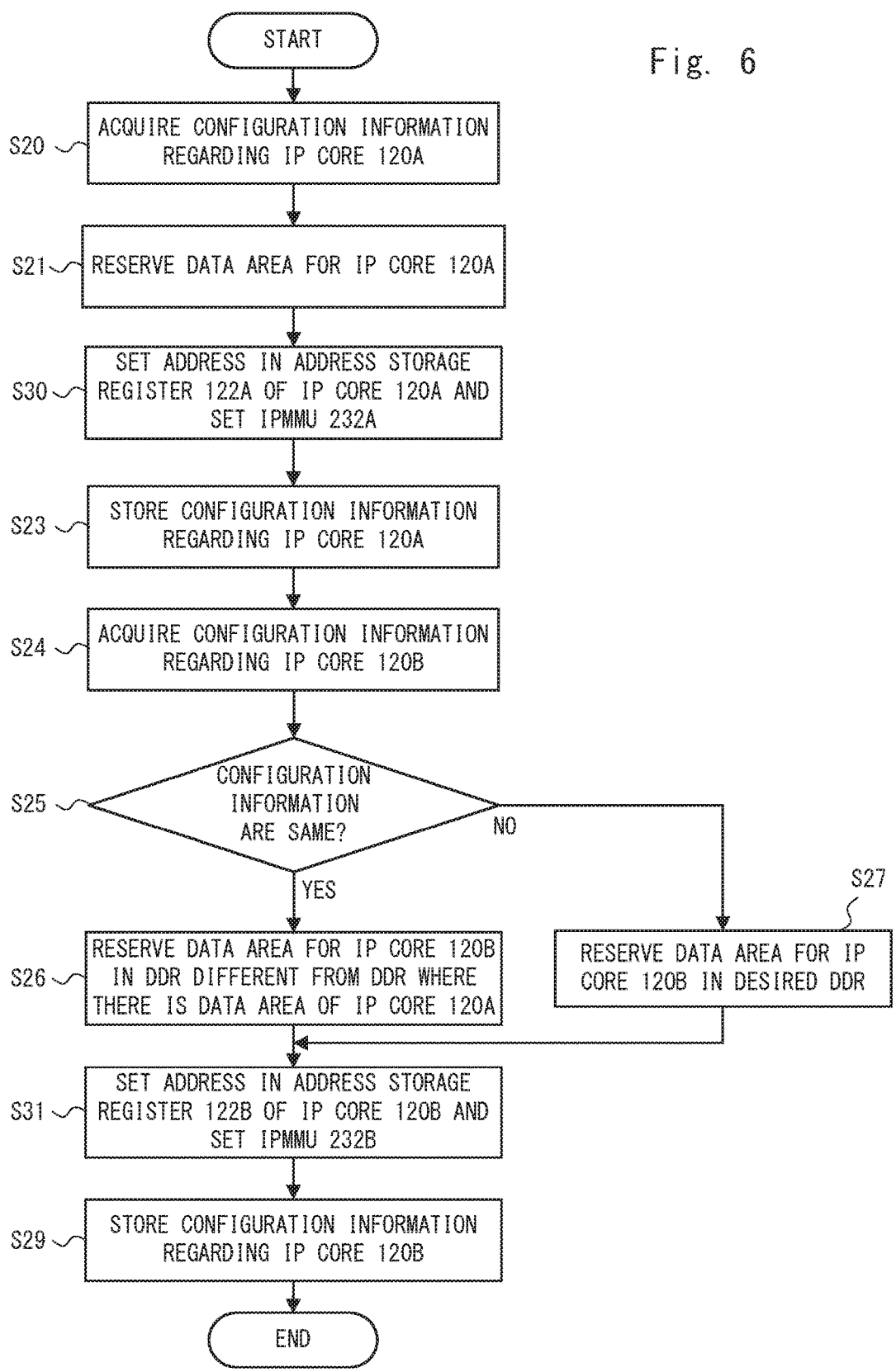
FIG. 6 is a flowchart showing one example of an operation of allocating data areas in the display system according to the second embodiment.

FIG. 6 is a flowchart showing one example of an operation of allocating the data areas in the display system 20 according to the second embodiment. The flowchart shown in FIG. 6 is different from the flowchart shown in FIG. 4 in that Step 22 is replaced by Step 30 and Step 28 is replaced by Step 31. In the following description, the difference between the flowchart shown in FIG. 4 and that shown in FIG. 6 will be described.

In this embodiment, after Step 21, as shown in FIG. 6, the allocation processing moves to Step 30. In Step 30 (S30), the allocation determining unit 112 sets the virtual address to specify the address of the DDR 131 allocated to the IP core 120A in the address storage register 122A of the IP core 120A. Further, the allocation determining unit 112 sets, for the IPMMU 232, a conversion rule regarding the virtual address set in the IP core 120A. In this way, the IP core 120A is ready to start image processing. After that, the allocation processing moves to Step 23.

Further, in this embodiment, after Step 26 and after Step 27, as shown in FIG. 6, the allocation processing moves to Step 31. In Step 31 (S31), the allocation determining unit 112 sets the virtual address to specify the address of the DDR 131 allocated to the IP core 120B in the address storage register 122B of the IP core 120B. Further, the allocation determining unit 112 sets, for the IPMMU 232, a conversion rule regarding the virtual address set in the IP core 120B. In this way, the IP core 120B is ready to start image processing. After that, the allocation processing moves to Step 29.

Figure 7:
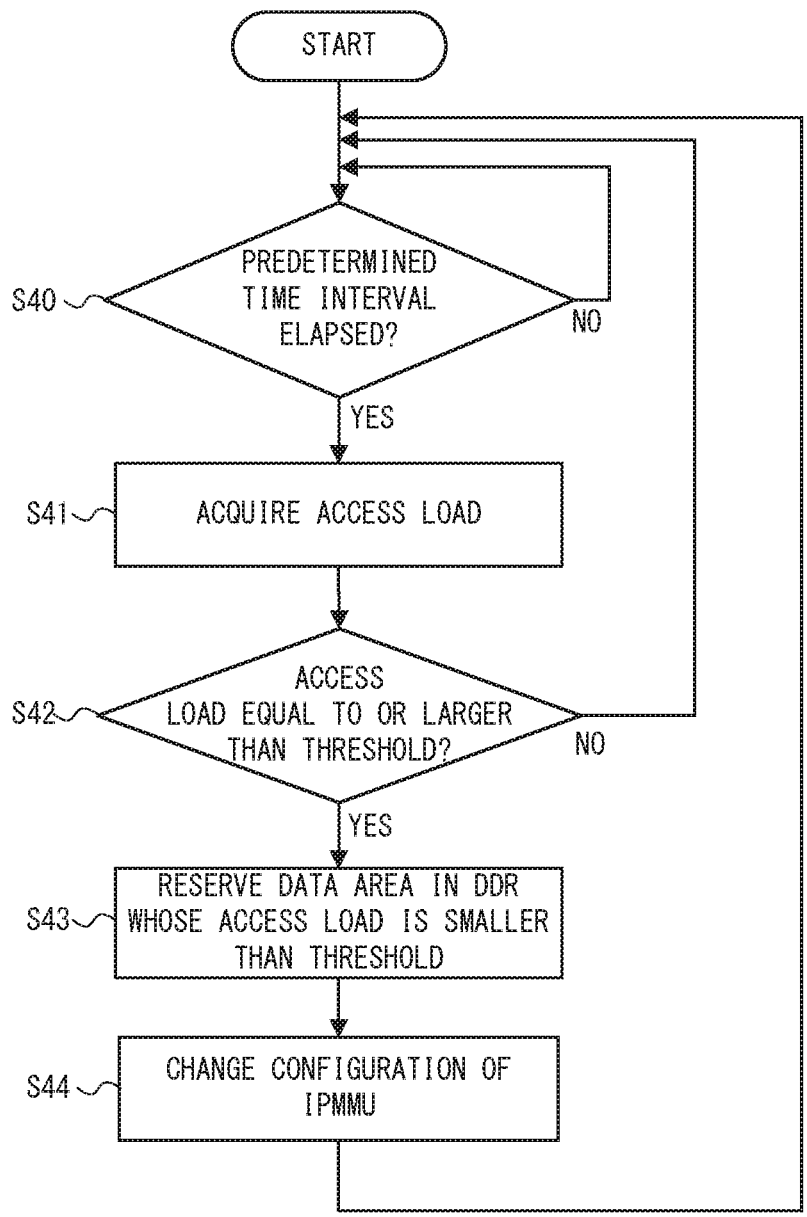
FIG. 7 is a flowchart showing one example of an operation of changing allocation of the data areas in the display system according to the second embodiment.

FIG. 7 is a flowchart showing one example of the operation of changing allocation of the data areas in the display system 20 according to the second embodiment. In the following description, with reference to FIG. 7, the operation of changing allocation of the data area in the display system 20 will be described.

In Step 40 (S40), the load acquiring unit 201 determines whether a predetermined time interval has elapsed. When the predetermined time interval has elapsed, the process goes to Step 41. On the other hand, when the predetermined time interval has not elapsed, the process of Step 40 is performed again.

In Step 41 (S41), the load acquiring unit 201 acquires the information indicating the access load of each of the DDRs 131 from the bus controller 132.

Next, in Step 42 (S42), the allocation changing unit 202 determines whether the access load of the DDR 131 allocated to the predetermined IP core 120 is equal to or larger than a predetermined threshold. The allocation changing unit 202 determines, for example, whether the access load of the DDR 131 allocated to the IP core 120A is equal to or larger than the predetermined threshold and whether the access load of the DDR 131 allocated to the IP core 120B is equal to or larger than the predetermined threshold. When the access load is equal to or larger than the predetermined threshold, the process goes to Step 43. On the other hand, when the access load is smaller than the predetermined threshold, the process goes back to Step 40.

In Step 43 (S43), the allocation changing unit 202 reserves a new data area in order to change the data area for the predetermined IP core 120 that accesses the DDR 131 whose access load exceeds the predetermined threshold. Specifically, the allocation changing unit 202 reserves the data area in the DDR 131 whose access load is smaller than the threshold. The allocation changing unit 202 may not necessarily reserve the data area in the DDR 131 whose access load is smaller than the threshold. That is, the allocation changing unit 202 may reserve the data area in another DDR 131 in accordance with a predetermined changing rule. This is because, even when the access load of the DDR 131 where there is a new data area is equal to or larger than the predetermined threshold, the change processing by the allocation changing unit 202 is performed again since the process goes back to Step 40 after Step 44. That is, it is because as a result of repeated changes, it is expected that the data area will be reserved in the DDR 131 whose access load is smaller than the predetermined threshold.

In Step 44 (S44), the allocation changing unit 202 sets, for the IPMMU 232, to change the conversion rule. Specifically, the allocation changing unit 202 changes the configuration of the IPMMU 232 so that the physical address after the conversion becomes the physical address in the new data area reserved in Step 43. Then after Step 44, the process goes back to Step 40.

It is assumed, for example, that the CPU 110 has started a new operation that involves access to the DDR 131A while the IP core 120A is executing the image processing using the data area allocated to the DDR 131A. The new operation may be any desired processing. The new operation may be, for example, music reproduction processing, navigation processing, or an internet communication in a car navigation system including the display system 10. Further, this new operation may not be the processing by the CPU 110 and may be processing by another IP core (not shown).

Due to the occurrence of the above new operation, the access load of the DDR 131A to which the data area of the IP core 120A is allocated increases. When the allocation changing unit 202 determines that the access load of the DDR 131A is equal to or larger than the predetermined threshold, the allocation changing unit 202 allocates a new data area to the IP core 120A. The allocation changing unit 202 changes, for example, the DDR 131 to be allocated to the IP core 120A from the DDR 131A to the DDR 131C whose access load is smaller than the threshold. Accordingly, the IP core 120A stores, for example, regarding the moving images from the first image to the image at the N-th frame (N is a natural number), the images after the image processing in the DDR 131A and regarding the moving images at the N+1 frame and the subsequent frames, the images after the image processing in the DDR 131C.

In the change processing by the allocation changing unit 202, only the conversion rule from the virtual address to the physical address is changed and there is no need to change the address set in the address storage register 122A of the IP core 120A. Accordingly, even when the operation of the IP core 120A is being performed, the DDR 131 to which the IP core 120A accesses can be changed. Accordingly, even when the access load of the DDR 131 is changed, stagnation of access by the IP core 120 can be suppressed.

While the invention made by the present inventor has been specifically described above, it is needless to say that the present invention is not limited to the embodiments already stated above and may be changed in various ways within the scope of the present invention. For example, while the display system that concurrently displays images on the plurality of display devices has been described in the embodiments above, an audio output system including a plurality IP cores that perform audio processing and a plurality of speakers, the audio output system concurrently outputting audio to the plurality of speakers, may be used. Further, an in-vehicle system including this audio output system and the display system according to the aforementioned embodiments combined each other may be used. Further, while the configuration including both the MMU 231 and the IPMMU 232 has been described in the second embodiment, the display system may not necessarily include the MMU 231.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a plurality of IP cores;
   a storage system comprising a plurality of storage devices;
   a configuration information acquiring unit that acquires, at a time of starting of processing using the storage system by the IP core, configuration information that specifies a timing when the IP core accesses one of the storage devices; and
   an allocation determining unit that determines the storage device allocated to an IP core among the plurality of IP cores that starts processing, wherein
   the configuration information acquiring unit acquires the configuration information regarding a first IP core among the plurality of IP cores and the configuration information regarding a second IP core among the plurality of IP cores, and
   the allocation determining unit determines, based on the configuration information regarding the first IP core and the configuration information regarding the second IP core acquired by the configuration information acquiring unit, whether a timing when the first IP core accesses one of the storage devices is the same as a timing when the second IP core accesses one of the storage devices, and when it is determined that the access timings are the same, determines allocation in such a way that the storage device allocated to the first IP core becomes different from the storage device allocated to the second IP core.

2. The semiconductor device according to claim 1, further comprising:

a load acquiring unit that acquires an access load of each of the plurality of storage devices; and an allocation changing unit that changes the allocation that has been determined by the allocation determination unit based on the access load of each of the plurality of storage devices acquired by the load acquiring unit.

3. The semiconductor device according to claim 2, wherein the storage system further comprises a memory management unit that performs conversion from a virtual address to a physical address, the IP core specifies an access destination using the virtual address, the memory management unit converts the virtual address of the access destination specified by the IP core into the physical address of the storage device, and the allocation changing unit changes the allocation by changing the physical address after conversion corresponding to the virtual address before conversion from a first physical address to a second physical address.

4. The semiconductor device according to claim 2, wherein the allocation changing unit changes, when the access load of the storage device allocated to a predetermined IP core among the plurality of IP cores by the allocation determining unit is equal to or larger than a predetermined threshold, the storage device to be allocated to the predetermined IP core.

5. The semiconductor device according to claim 1, wherein the first IP core and the second IP core each performs image processing, and the configuration information comprises a frame rate, an image size, and a color format of a moving image.

6. An allocation method comprising:

acquiring, at a time of starting of processing using a storage system by a first IP core, first configuration information that specifies a timing when the first IP core accesses one of storage devices included in the storage system;

acquiring, at a time of starting of processing using the storage system by a second IP core, second configuration information that specifies a timing when the second IP core accesses one of the storage devices included in the storage system;

determining, based on the first configuration information and the second configuration information, whether a timing when the first IP core accesses one of the storage devices is the same as a timing when the second IP core accesses one of the storage devices; and determining, when it is determined that the access timings are the same, allocation of the storage device to the first IP core and allocation of the storage device to the second IP core in such a way that the storage device allocated to the first IP core becomes different from the storage device allocated to the second IP core.

7. The allocation method according to claim 6, further comprising:

acquiring an access load of each of the storage devices; and changing, based on the access load of each of the storage devices that have been acquired, the allocation that has been determined.

8. The allocation method according to claim 7, wherein the IP core specifies an access destination using a virtual address, the storage system comprises a memory management unit that converts the virtual address of an access destination specified for the IP core into a physical address of the storage device, and in the method, when the allocation that has been determined is changed, the physical address after conversion corresponding to the virtual address before conversion is changed from a first physical address to a second physical address, to thereby change the allocation.

9. The allocation method according to claim 7, comprising in a case in which the allocation that has been determined is changed, changing, when the access load of the storage device allocated to a predetermined IP core of the first IP core and the second IP core is equal to or larger than a predetermined threshold, the storage device to be allocated to the predetermined IP core.

10. The allocation method according to claim 6, wherein the first IP core and the second IP core each perform image processing, and the configuration information comprises a frame rate, an image size, and a color format of a moving image.

11. A display system comprising:

a first display device;

a second display device;

a first IP core that performs image processing on image data to be displayed on the first display device;

a second IP core that performs image processing on image data to be displayed on the second display device;

a storage system comprising a plurality of storage devices;

a configuration information acquiring unit that acquires, at a time of starting of processing using the storage system by the first IP core, first configuration information for specifying a timing when the first IP core accesses one of the storage devices and, at a time of starting of processing using the storage system by the second IP core, second configuration information for specifying a timing when the second IP core accesses one of the storage devices; and an allocation determining unit that determines the storage device to be allocated to one of the first IP core and the second IP core that starts processing, wherein the configuration information comprises a frame rate, an image size, and a color format of a moving image, and the allocation determining unit determines, based on the first configuration information and the second configuration information acquired by the configuration information acquiring unit, whether a timing when the first IP core accesses the storage device is the same as a timing when the second IP core accesses the storage device, and when it is determined that the access timings are the same, determines allocation in such a way that the storage device allocated to the first IP core becomes different from the storage device allocated to the second IP core.

* * * * *